United States Patent
Arai et al.

(10) Patent No.: US 7,901,986 B2
(45) Date of Patent: Mar. 8, 2011

(54) WIRING SUBSTRATE, MANUFACTURING METHOD THEREOF, AND SEMICONDUCTOR DEVICE

(75) Inventors: Tadashi Arai, Nagano (JP); Toshio Kobayashi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 148 days.

(21) Appl. No.: 11/984,004

(22) Filed: Nov. 13, 2007

(65) Prior Publication Data

US 2008/0155820 A1 Jul. 3, 2008

(30) Foreign Application Priority Data

Dec. 27, 2006 (JP) .................... 2006-351000

(51) Int. Cl.
*H01L 21/00* (2006.01)

(52) U.S. Cl. ........ 438/108; 438/113; 438/123; 438/124; 257/E21.5; 257/E21.499

(58) Field of Classification Search .......... 438/74, 438/109, 15, 25, 26, 51, 55, 64–67, 106, 438/112, 124–127, FOR. 379, FOR. 384; 257/678–733, 787–796, E23.001–E23.194, 257/100, 433, 434, 667, E21.499–E21.519
See application file for complete search history.

(56) References Cited

U.S. PATENT DOCUMENTS

| | | | |
|---|---|---|---|
| 6,551,858 B2 * | 4/2003 | Kawata et al. ............. 438/109 |
| 6,661,088 B1 | 12/2003 | Yoda et al. |
| 7,049,692 B2 | 5/2006 | Nishimura et al. |
| 7,119,428 B2 * | 10/2006 | Tanie et al. ................ 257/686 |
| 2004/0051168 A1 * | 3/2004 | Arai et al. ................. 257/678 |
| 2004/0150118 A1 * | 8/2004 | Honda ..................... 257/778 |
| 2006/0022328 A1 * | 2/2006 | Lee ......................... 257/698 |
| 2006/0214153 A1 * | 9/2006 | Ikezawa et al. ............ 257/40 |
| 2007/0023887 A1 * | 2/2007 | Matsui ..................... 257/686 |
| 2008/0136003 A1 * | 6/2008 | Pendse .................... 257/686 |

FOREIGN PATENT DOCUMENTS

JP 2001-102479 4/2001
JP 2004-273938 9/2004

* cited by examiner

*Primary Examiner* — Khiem D Nguyen
*Assistant Examiner* — Su C Kim
(74) *Attorney, Agent, or Firm* — Kratz, Quintos & Hanson, LLP

(57) ABSTRACT

In a wiring substrate according to the present invention, a base wiring board is constructed by stacking a plurality of unit wiring boards each having wiring patterns which enable an electrical connection between upper and lower sides, in a state that the plurality of unit wiring boards are connected to each other via a connection terminal, and a silicon interposer is stacked on the base wiring board via a connection terminal, and a resin portion is filled in a gap between the plurality of unit wiring boards as well as a gap between the base wiring board and the silicon interposer, and a resin portion serves as a substrate which integrates the base wiring board and the silicon interposer.

2 Claims, 7 Drawing Sheets

WIRING SUBSTRATE, MANUFACTURING METHOD THEREOF, AND SEMICONDUCTOR DEVICE

CROSS-REFERENCE TO RELATED APPLICATIONS

This application is based on and claims priority of Japanese Patent Application No. 2006-351000 filed on Dec. 27, 2006, the entire contents of which are incorporated herein by reference.

BACKGROUND OF THE INVENTION

1. Field of the Invention

The present invention relates to a wiring substrate, a manufacturing method thereof and a semiconductor device, and particularly relates to a silicon interposer built-in wiring substrate which can correspond to the mounting of a high-performance semiconductor chip and a manufacturing method thereof and a semiconductor device.

2. Description of the Related Art

In the prior art, there has been a semiconductor device in which a semiconductor chip such as a CPU is mounted on a wiring substrate therein. As the wiring substrate on which the semiconductor chip is mounted, a build-up wiring board is generally used in which wirings are formed into multiple layers at fine pitches.

In recent years, connection electrodes have come to have smaller pitches, accompanying with a further higher performance of a semiconductor chip. Since there is a limitation to make the pitch finer between wirings of a build-up wiring board, it has begun to be difficult to directly mount such a semiconductor chip on the build-up wiring board. As a countermeasure to that difficulty, a method has been proposed in which a semiconductor chip is connected to a build-up wiring board via a silicon interposer therebetween, the silicon interposer having fine wirings which enable electrical connection between the upper and lower sides.

Patent Literature 1 (Japanese Patent Application Laid-Open No. 2001-102479) describes that, in order to decrease the number of wiring layers in a semiconductor chip, a function of wirings in the semiconductor chip is transferred to an interposer, and the semiconductor chip is mounted on a wiring substrate via the interposer therebetween.

Patent Literature 2 (Japanese Patent Application Laid-Open No. 2004-273938) describes that an interposer substrate is disposed between an upper device unit and a lower device unit. In the upper device unit, a semiconductor element is mounted on a first wiring substrate having an external connection terminal. In the lower device unit, a semiconductor element is mounted on a second wiring substrate having a connection electrode.

As described above, with a higher performance of a semiconductor chip, wirings in a build-up wiring board further need to be formed into multiple layers at fine pitches, and moreover a silicon interposer needs to be introduced. As a result, the increase in cost for a semiconductor device and the decrease in the yield thereof tend to occur.

For example, at a time of pulling-out a wiring from a through-hole land of a build-up wiring board so as to dispose an interposer pad to which a silicon interposer is connected, there is a case where the through-hole land becomes an obstacle in the middle of pulling-out the wiring, making it impossible to pull-out the wiring. Thus, the number of wiring layers of the build-up wiring board needs to be increased to solve the problem.

At this time, in the case of the build-up wiring board of the prior art, even when the problem can be solved by adding a wiring only on one surface side, it is necessary to symmetrically form the wirings on both surface sides of the core substrate so as to prevent an occurrence of warping, as the result, a problem in which it costs unnecessary expenses is occurs.

As described above, in the case of the build-up wiring board of the prior art, to form the unnecessary wirings is necessary upon making it correspond to the higher performance of a semiconductor chip. As a result, the number of wiring layers becomes enormous in some cases, leading to concerns of the increase in cost and the decrease in yield. Furthermore, when the silicon interposer is connected to the top of the build-up wiring board to construct an interposer built-in wiring substrate, the structure have a high reliability is required.

SUMMARY OF THE INVENTION

It is an object of the present invention to provide a wiring substrate in which the layer number of wiring patterns can be set to necessary minimum in accordance with a specification of the silicon interposer, and the manufacturing steps are simplified to be manufactured at low cost and with high yield, and it has a high reliability, in the wiring substrate in which a silicon interposer is built, and a manufacturing method thereof, and a semiconductor device.

The present invention relates to a wiring substrate which includes a base wiring board constructed by stacking a plurality of unit wiring boards each having wiring patterns which enable an electrical connection between upper and lower sides, in a state that the plurality of unit wiring boards are connected to each other via a connection terminal, a silicon interposer which is stacked on the base wiring board, and having wiring patterns which enable an electrical connection between upper and lower sides, and connected to the wiring patterns of the base wiring board via a connection terminal, and a resin portion which is filled in a gap between the plurality of unit wiring boards as well as a gap between the base wiring board and the silicon interposer, and which integrates the base wiring board and the silicon interposer.

The base wiring board constructing the wiring substrate of the present invention is constructed in such a way that a plurality of unit wiring boards having wiring patterns which enable the electrical connection between the upper and lower sides, are stacked in the thickness direction so that the plurality of unit wiring boards are connected to each other via the connection terminal. The silicon interposer which has fine wirings on which a high-performance semiconductor chip is mounted is connected on the base wiring board via the connection terminal.

Furthermore, the gap between the plurality of unit wiring boards as well as the gap between the base wiring board and the silicon interposer are filled with resin portion, and the resin portion serves as a substrate which integrates the base wiring board and the silicon interposer. The silicon interposer is embedded in the resin portion in a state of exposing the upper surface thereof on which a semiconductor chip is mounted.

In the wiring substrate according to the present invention, connection electrodes with a narrow pitch of the high-performance semiconductor chip is connected to the silicon interposer having fine wirings, and the pitch is converted from the silicon interposer to the base wiring board.

In the present invention, the unit wiring boards having the wiring patterns which enable the electrical connection between the upper and lower sides are used as one unit, and are stacked on and connected to each other to construct the base wiring board. Thus, unlike the build-up wiring board of the prior art, when the layer number of wiring layers is increased, it is not necessary to symmetrically form the wiring patterns on both surfaces of the core substrate taking the prevention of warping into consideration. Additionally, the base wiring board can be constructed with the necessary minimum layer number of wiring patterns in accordance with the specification of the silicon interposer. Therefore, there is no possibility that the increase in cost and the decrease in yield occur due to the formation of unnecessary wiring patterns.

In one preferred mode of the present invention, a mold compound resin containing a large amount of fillers (epoxy resin containing 85 to 90 percent silica filler as an example) is used as the material of the resin portion. The thermal expansion coefficient of the resin portion is 7 ppm/° C. to 20 ppm/° C., and the elastic modulus is 15 GPa to 25 GPa. By forming the resin portion from such a resin material, the thermal expansion coefficients between the silicon interposer, the base wiring board and the resin portion can be made to approximate rather that the case of where a general resin material is used. Thus, an occurrence of the warping to the wiring substrate can be suppressed. Furthermore, the resin portion is formed of the resin material having the high elastic modulus. Thereby, the resin portion serves as a substrate which has a high rigidity to integrally support the base wiring board and the silicon interposer.

In this way, according to the present invention, the base wiring board and the silicon interposer are sealed with the resin having the high rigidity to suppress the occurrence of the warping, and thereby the wiring substrate having a high reliability is constructed.

Moreover, the present invention relates to a method of manufacturing a wiring substrate, which includes the steps of: preparing a base wiring board constructed by stacking a plurality of unit wiring boards each having wiring patterns which enable an electrical connection between upper and lower sides, in a state that the plurality of unit wiring boards are connected to each other via a connection terminal, and obtaining an interposer-attached wiring substrate by connecting the silicon interposer to the wiring patterns of the base wiring board via a connection terminal, and forming a resin portion which integrates the base wiring board and the silicon interposer, by disposing a mold die on the interposer-attached wiring substrate, then, filling a resin in a gap between the plurality of unit wiring boards as well as a gap between the base wiring board and the silicon interposer by means of vacuum transfer molding.

By adopting the method of manufacturing a wiring substrate according to the present invention, the above-described wiring substrate can be easily manufactured. According to the present invention, firstly, a plurality of unit wiring boards are stacked to form the base wiring board. Then, the silicon interposer is connected on the base wiring board to obtain the interposer-attached wiring substrate. Subsequently, the mold die is disposed on the interposer-attached wiring substrate. Thereafter, a resin is filled in the gap between the plurality of unit wiring boards as well as the gap between the base wiring board and the silicon interposer by means of vacuum transfer molding. The use of the vacuum transfer molding enables a resin to be reliably filled in a fine gap even in the case that a mold compound resin containing a large amount of fillers is used.

As described above, the wiring substrate according to the present invention is constructed by disposing the silicon interposer on the base wiring board in which the unit wiring boards are stacked each other, and filling the resin in the gaps thereamong. Accordingly, the wiring substrate is manufactured with low cost and high yield, and a high reliability thereof is obtained.

DETAILED DESCRIPTION OF THE PREFERRED EMBODIMENTS

Embodiment of the present invention will be explained with reference to the accompanying drawings hereinafter.

Figure 5:
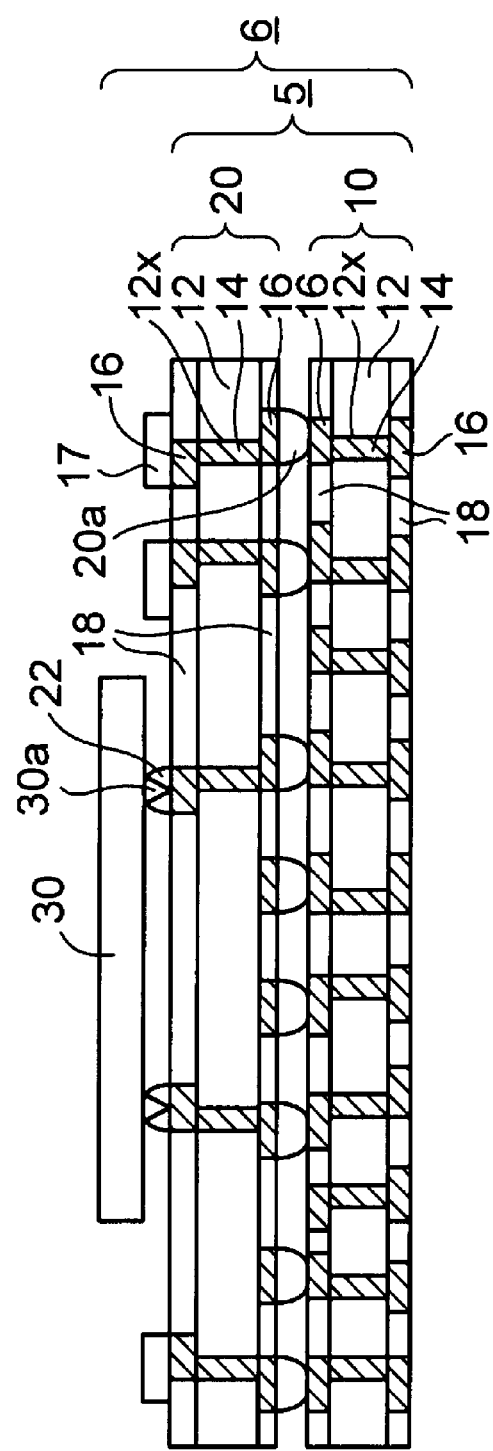
FIG. 5 is a sectional view (Part 5) showing a method of manufacturing a wiring substrate according to the embodiment of the present invention.
Figure 6:
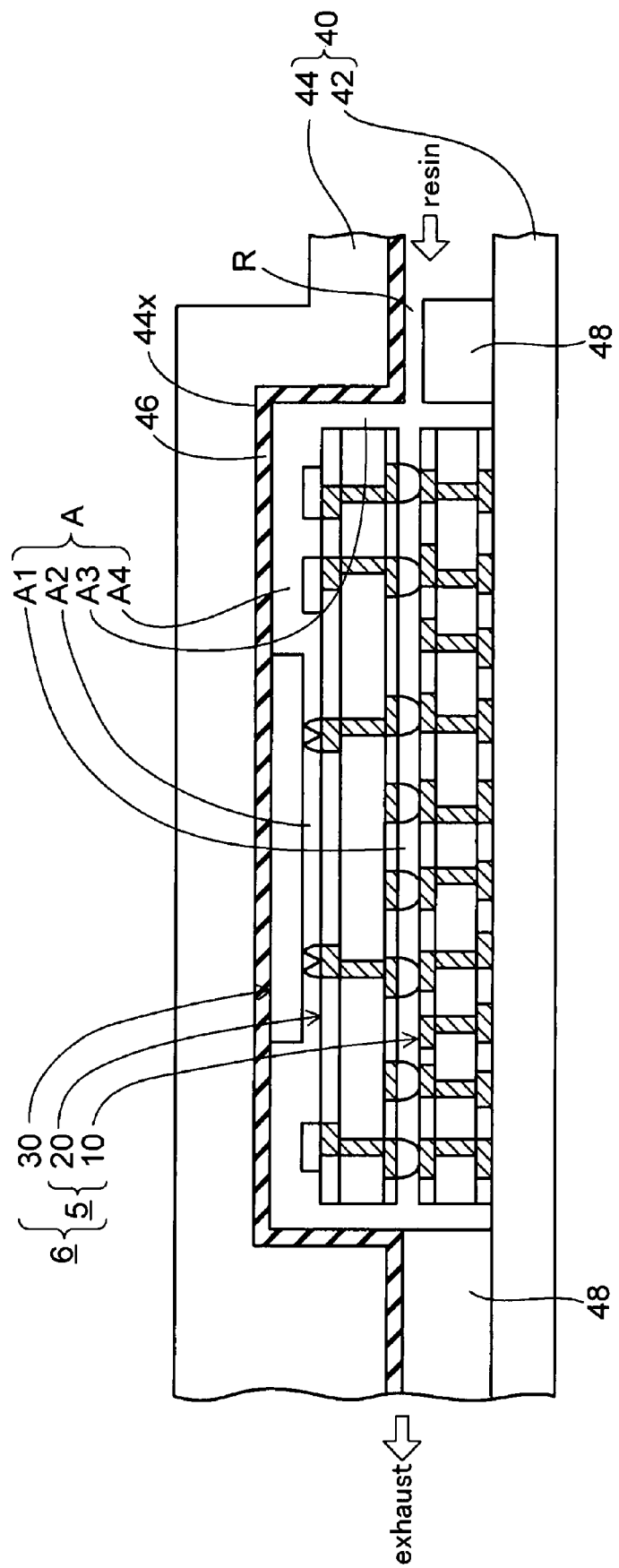
FIG. 6 is a sectional view (Part 6) showing a method of manufacturing a wiring substrate according to the embodiment of the present invention.
Figure 7:
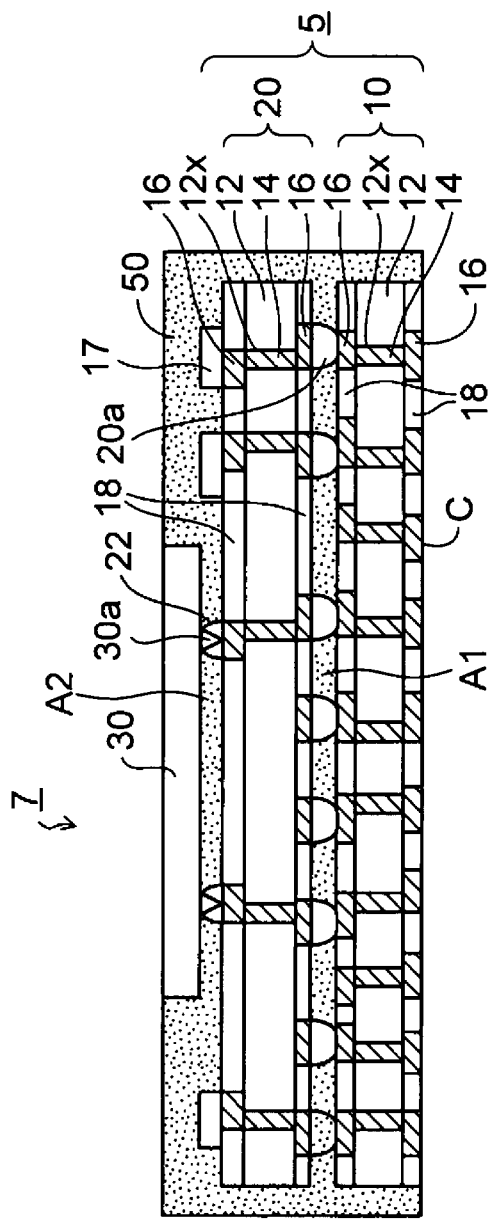
FIG. 7 is sectional view showing an interposer built-in wiring substrate of an LGA type according to an embodiment of the present invention.
Figure 8:
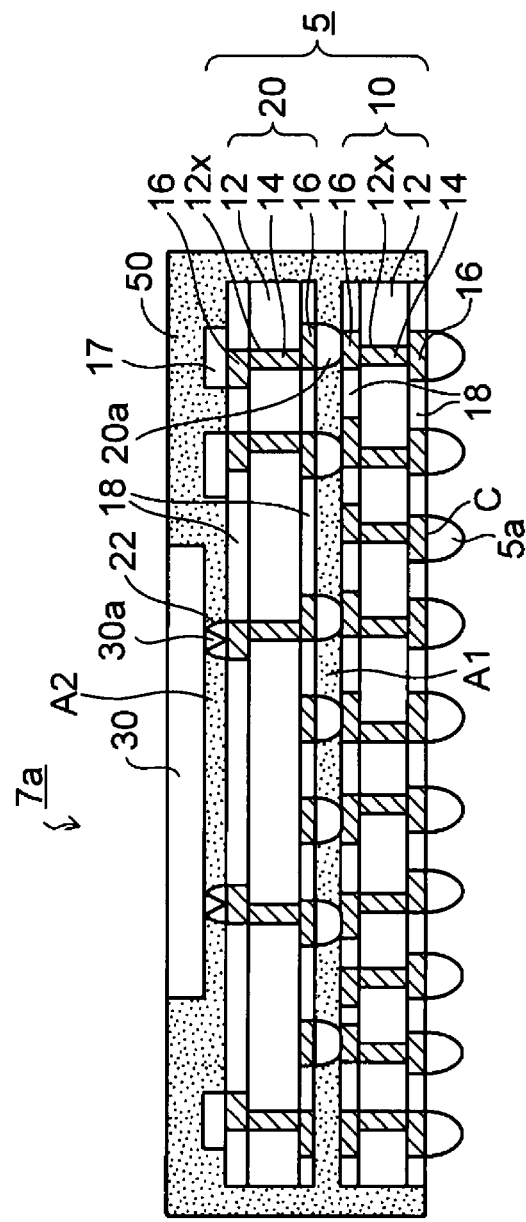
FIG. 8 is sectional view showing an interposer built-in wiring substrate of a BGA type according to the embodiment of the present invention.
Figure 9:
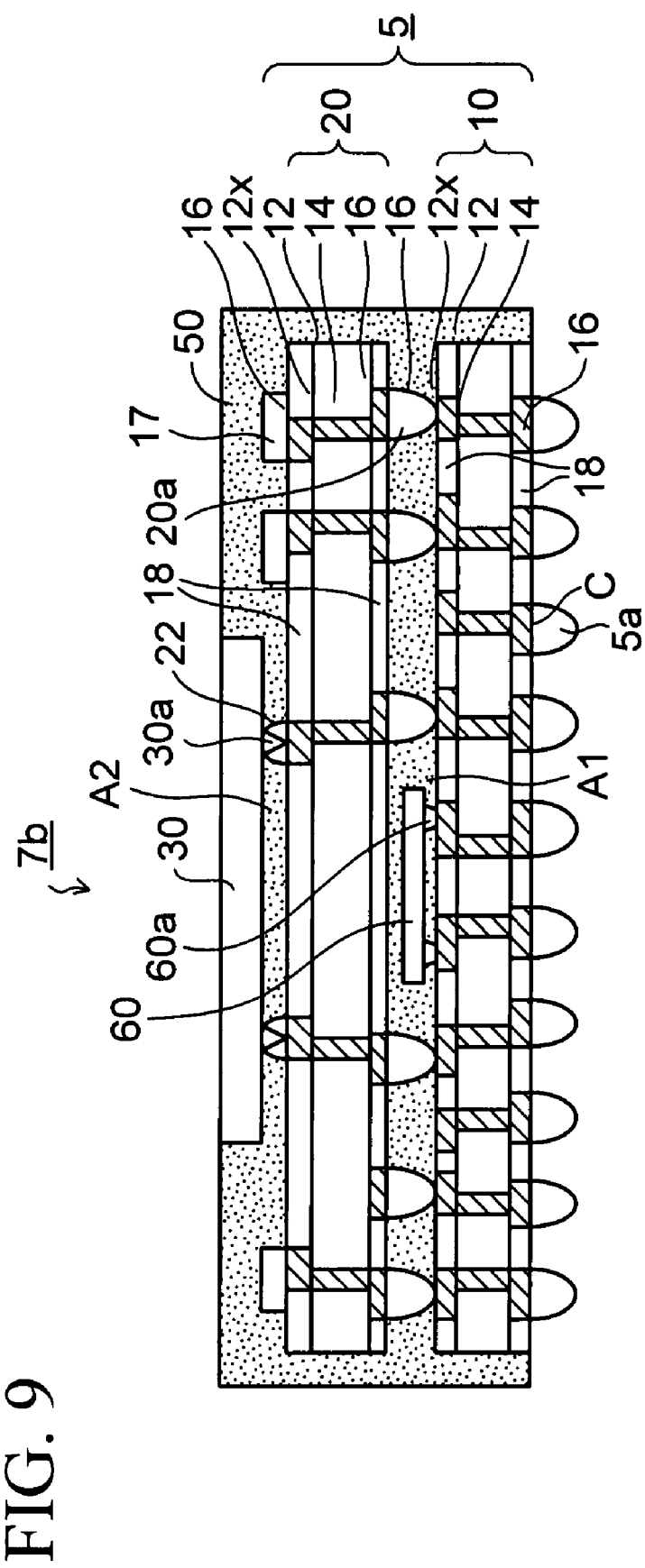
FIG. 9 is sectional view showing an interposer built-in wiring substrate according to a modification of the embodiment of the present invention.
Figure 10:
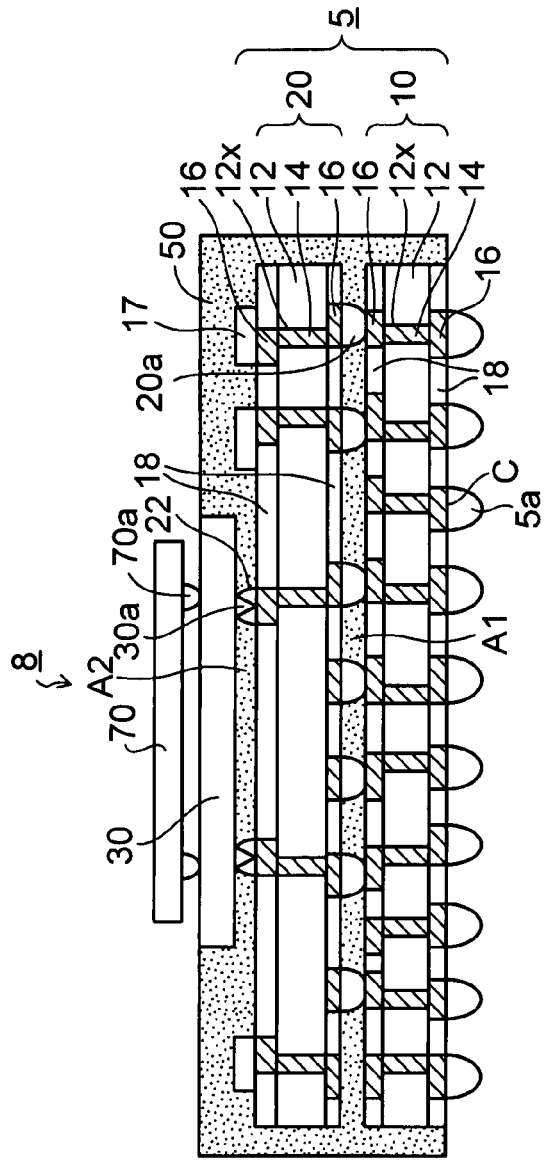
FIG. 10 is a sectional view showing a semiconductor device according to an embodiment of the present invention.
Figure 11:
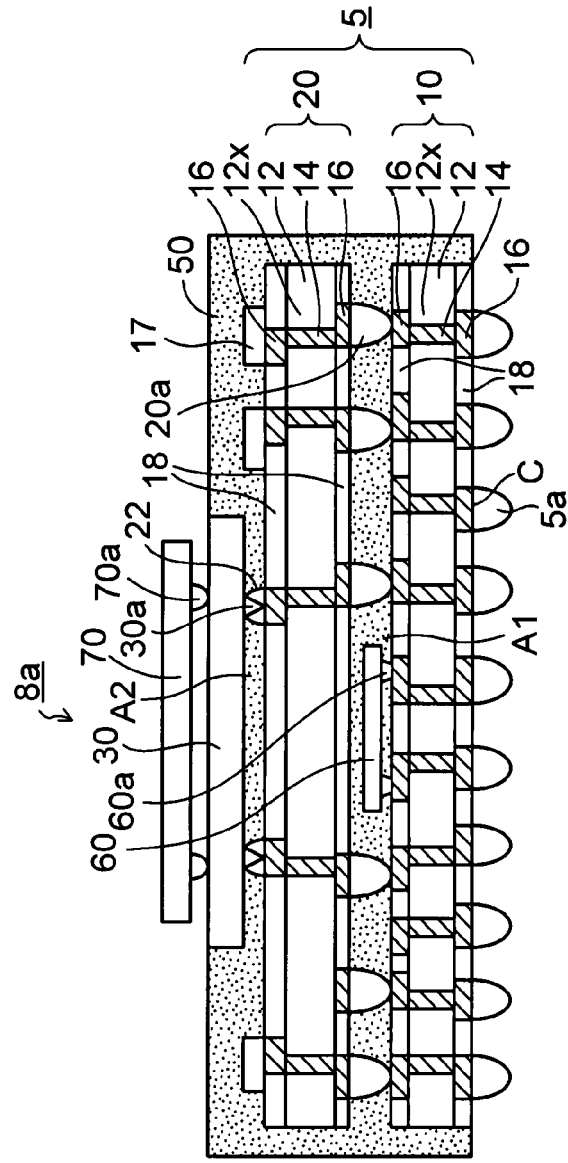
FIG. 11 is a sectional view showing a semiconductor device according to a modification of the embodiment of the present invention.

FIGS. 1 to 6 are sectional views each showing a method of manufacturing a wiring substrate according to an embodiment of the present invention, FIGS. 7 to 9 are sectional views each showing a wiring substrate according to an embodiment of the present invention, and similarly, FIGS. 10 and 11 are sectional views each showing a semiconductor device.

Figure 1:
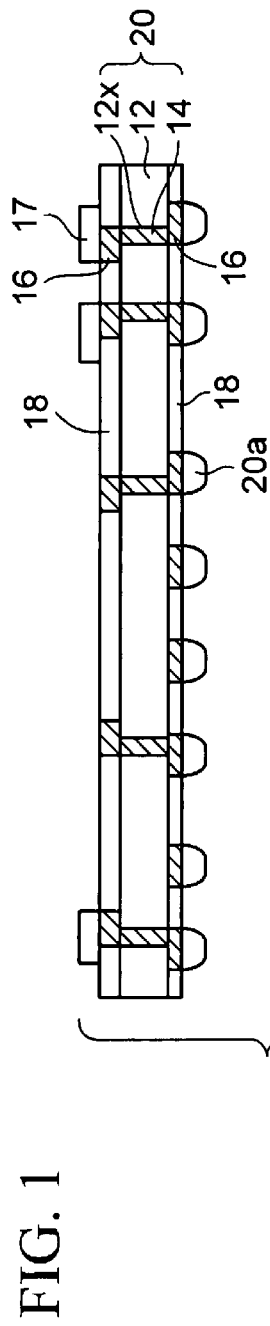
FIG. 1 is a sectional view (Part 1) showing a method of manufacturing a wiring substrate according to an embodiment of the present invention.

Firstly, in the method of manufacturing a wiring substrate according to this embodiment, as shown in FIG. 1, a sheet-like first unit wiring board 10 and a sheet-like second unit wiring board 20 which respectively have wiring patterns 16 which enable electrical connection between the upper and lower sides are prepared. In the first unit wiring board 10, through-holes 12x are formed in an insulating layer 12 which is made of, for example, an epoxy resin (prepreg), or the like, containing glass fabrics. Each through-hole 12x is filled with a through-hole-conductive layer 14 which is made of copper or the like.

Furthermore, on both surface sides of the insulating layer 12, wiring patterns 16 made of copper or the like are formed. The wiring patterns 16 on both surface sides are connected to each other via the through-hole-conductive layer 14. In addition, solder resists 18 having openings are formed on both surface sides of the insulating layer 12, and the openings are provided on the connection parts of the wiring patterns 16.

In the second unit wiring board 20, similarly to the first unit wiring board 10, the wiring patterns 16 are formed and connected to each other via a through-hole-conductive layer 14 in a through-hole 12x on both surface sides of an insulating layer 12. In addition, similarly to the first unit wiring board 10, solder resists 18 having openings are formed on both surface sides of the insulating layer 12, and the openings are provided on the connection parts of the wiring patterns 16. Moreover, a capacitor component 17 is mounted to be connected to the wiring pattern 16 on the upper surface side of the second unit wiring board 20. Note that, besides the capacitor 17, a passive component such as a resistance component or an inductor component may be mounted thereon.

In addition, in the second unit wiring board 20, a connection terminal 20a is provided to the connection part of the wiring pattern 16 on the lower surface side of the insulating layer 12. The connection terminal 20a is formed of a silver (Ag) paste, a solder paste, a solder ball, a copper ball covered with solder on the outer surface, a gold bump, or the like, and the height is set to 30 μm to 100 μm.

Each wiring pattern 16 of the first unit wiring board 10 and the second unit wiring board 20 are formed by below method. Firstly, the through-hole 12x is formed in the insulating layer 12. Subsequently, a metal layer which is connected to both surfaces of the insulating layer 12 from the inside of the through-hole 12x, is formed by means of a plating method. Thereafter, the metal layer is patterned by photolithography and etching. Alternatively, the wiring pattern may be formed on both surface sides on the bases of processing a copper-clad laminate. Each wiring pattern 16 of the first unit wiring board 10 and the second unit wiring board 20 is set to have a minimum width of, for example, 30 μm to 50 μm.

Incidentally, in the embodiment exemplified above, the wiring pattern 16 of the first unit wiring board 10 and the second unit wiring board 20 is formed in one layer on both surface sides. However, each wiring pattern 16 may be laminated on both surface sides of the insulating layers 12 in n layers (n being an integer of 2 or more). The first and second unit wiring boards 10, 20 may be flexible wiring boards, or may be rigid wiring boards.

Figure 2:
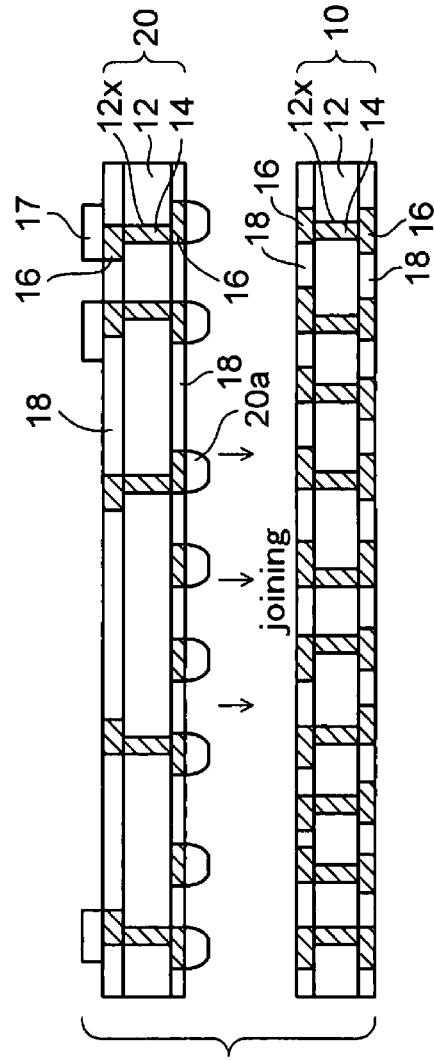
FIG. 2 is a sectional view (Part 2) showing a method of manufacturing a wiring substrate according to the embodiment of the present invention.

Subsequently, as shown in FIG. 2, the second unit wiring board 20 is disposed on the first unit wiring board 10 so that the connection terminals 20a of the second unit wiring board 20 can match the connection parts of the wiring patterns 16 of the upper side of the first unit wiring board 10. In addition, a heat treatment is performed thereto at a temperature of 180° C. to 220° C., so that the connection terminals 20a of the second unit wiring board 20 are joined to the connection parts of the wiring patterns 16 on the upper surface of the first unit wiring board 10. When the connection terminals 20a of the second unit wiring board 20 are formed of gold bumps, gold layers are formed on the connection parts of the wiring patterns 16 of the first unit wiring board 10, and connected thereto by means of ultrasonic bonding.

Figure 3:
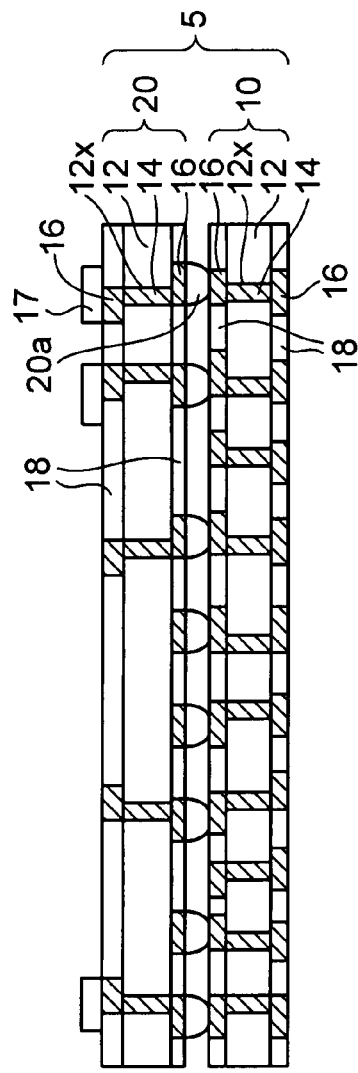
FIG. 3 is a sectional view (Part 3) showing a method of manufacturing a wiring substrate according to the embodiment of the present invention.

Consequently, as shown FIG. 3, the first and second unit wiring boards 10 and 20, each having the wiring patterns 16 of two layers, are stacked and connected in a three dimensional manner in the thickness direction, and thus a base wiring board 5 is constructed. The base wiring board 5 is constructed to have the wiring patterns 16 of four layers, which are connected to each other with the through-hole-conductive layers 14 and the connection terminals 20a interposed therebetween, and the capacitor components 17 are mounted on the uppermost wiring patterns 16. Incidentally, instead of providing the connection terminals 20a on the second unit wiring board 20, the connection terminals may be provided on the wiring patterns 16 on the upper surface of the first unit wiring board 10.

Figure 4:
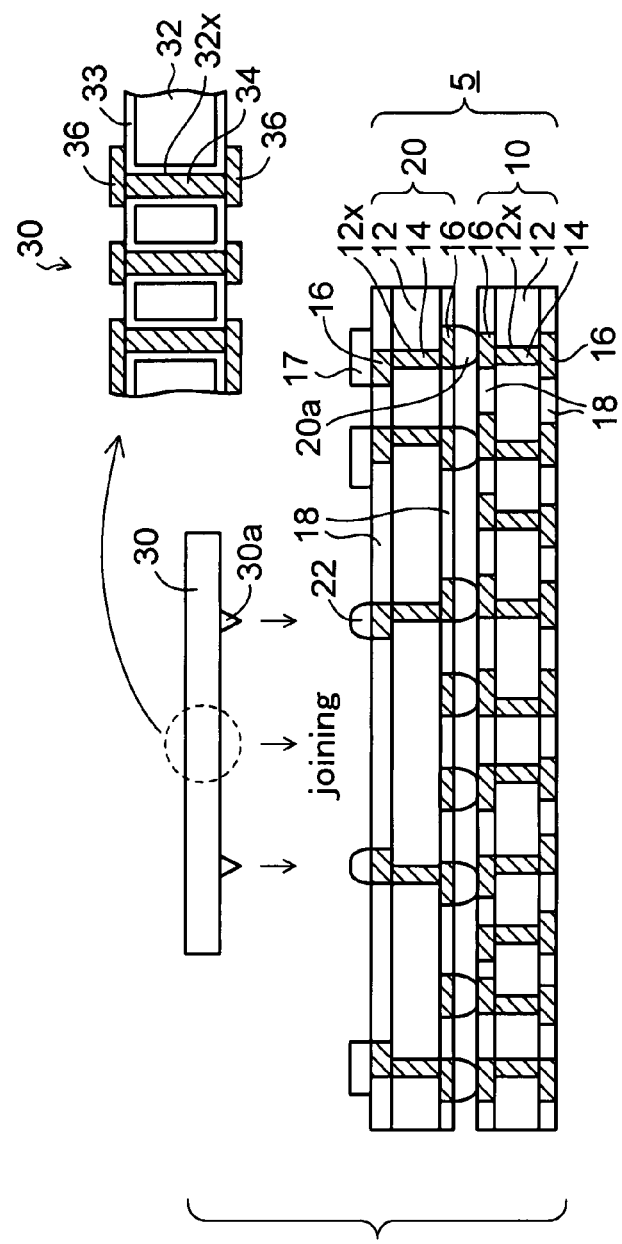
FIG. 4 is a sectional view (Part 4) showing a method of manufacturing a wiring substrate according to the embodiment of the present invention.

Next, as shown in FIG. 4, a silicon interposer 30 having wiring patterns 36 which enable the electrical connection between the upper and lower sides is prepared. In the silicon interposer 30, through-holes 32x are provided in a silicon substrate 32, and insulating layers 33 are formed on both surfaces of the silicon substrate 32 as well as on the inner surfaces of the through-holes 32x. The through-hole 32x is filled with a through-hole-conductive layer 34 formed of copper or the like. Furthermore, on both surface sides of the silicon substrate 32, the wiring patterns 36 made of copper or the like are formed. The wiring patterns 36 are connected to each other via the through-hole-conductive layer 34.

Since the silicon interposer 30 is manufactured by manufacturing processes of a semiconductor integrated circuit, the silicon interposer 30 is formed at a finer pitch rather than the case of the wiring pattern 16 of the above-described base wiring board 5 and, and the minimum width thereof is formed to be in the range of, for example, 3 μm to 5 μm. In addition, connection terminals 30a each made of a gold bump or the like and which has a height of 30 μm to 100 μm are formed onto the wiring pattern 36 of the lower surface of the silicon interposer 30. Note that, the wiring patterns 36 of the silicon interposer 30 may be stacked on both surface sides of the silicon substrate 32 in an arbitrary number of layers.

As shown also in FIG. 4, solder materials 22 are formed on connection parts for the interposer, which are on the uppermost wiring patterns 16 of the base wiring board 5. The solder materials 22 are formed of a solder ball or a solder paste. Subsequently, the silicon interposer 30 is disposed on the base wiring board 5 so that the connection terminals 30a of the silicon interposer 30 match the solder materials 22 on the base wiring board 5. Furthermore, a heat treatment is performed at a temperature of 180° C. to 220° C., so that the connection terminals 30a of the interposer 30 are joined to the solder materials 22 provided on the base wiring board 5, and thereby electrically connected to the wiring patterns 16 of the base wiring board 5.

Thus, as shown in FIG. 5, the silicon interposer 30 is stacked to be connected onto the base wiring board 5 in a three dimensional manner, whereby an interposer-attached wiring substrate 6 is obtained. At this time, between the first unit wiring board 10 and the second unit wiring board 20, as well as between the second unit wiring board 20 and the silicon interposer 30, there exist gaps which correspond to a thickness of the connection terminal 20a of the second unit wiring board 20, and to a thickness of the connection terminal 30a of the silicon interposer 30, respectively.

Next, as shown in FIG. 6, a mold die 40 which is basically constructed by a lower die 42 and an upper die 44 is prepared. Then, the interposer-attached wiring substrate 6 of FIG. 5 is disposed on the lower die 42. Furthermore, the upper die 44 having a concave portion 44x to the lower surface side is disposed on the interposer-attached wiring substrate 6. On the lower surface of the upper die 44, a release film 46 is provided, so that the upper surface of the silicon interposer 30 of the interposer-attached wiring substrate 6 is in a state of being held down by the release film 46. The release film 46 protects the silicon interposer 30, and also serves as a release layer to easily separate the upper die 44 from a resin which is filled in the dies.

Moreover, on periphery portions of the lower die 42, spacers 48 are disposed to surround the interposer-attached wiring substrate 6, and on a region along one side of the interposer-attached wiring substrate 6, a resin-introducing portion R is constructed by the spacers 48 and the upper die 44. The other spacer 48 which is disposed on a region except the resin-introducing portion R is in contact with the release film 46 disposed under the upper die 44, thereby the resin-introducing can be stopped there.

In this way, the interposer-attached wiring substrate 6 is interposed between the lower die 42 and the upper die 44, whereby the resin-introducing portion R as well as a space A to be filled with resin are formed, the space A being connected to the resin-introducing portion R. The space A to be filled with a resin includes: a gap A1 between the first unit wiring board 10 and the second unit wiring board 20; a gap A2 between the second unit wiring board 20 and the silicon interposer 30; a gap A3 between the outer peripheral surface of the base wring board 5 and the mold die 40; and a gap A4 around the silicon interposer 30.

Next, as also shown in FIG. 6, a molten resin is introduced into the space A constructed by the mold die 40 through the resin-introducing part R. At this time, the resin is introduced in a state where the space A is depressurized (or vacuumized) by exhausting the air. Thus, the resin is introduced into the space A in the mold die 40 through the resin-introducing part R, so that the resin is filled in the gap A1 between the first unit wiring board 10 and the second unit wiring board 20, the gap A2 between the second unit wiring board 20 and the silicon interposer 30, and the like.

In addition, after the resin pushed into the space A is heat-treated and cured, the mold die 40 is detached from the interposer-attached wiring substrate 6 to expose the resin. At this time, the release film 46 exists on the lower surface of the upper die 44. For this reason, the upper die 44 can be easily detached from the resin. Thereafter, the resin formed on the resin-introducing part R is broke up and discarded.

Thus, as shown in FIG. 7, the resin is filled in the gap A1 between the first unit wiring board 10 and the second unit wiring board 20, the gap A2 between the second unit wiring board 20 and the silicon interposer 30, and the like, so that a resin portion 50 which integrates the base wiring board 5 and the silicon interposer 30 in one body is formed. Incidentally, when the gap A1 between the first unit wiring board 10 and the second unit wiring board 20 and the gap A2 between the second unit wiring board 20 and the silicon interposer 30 are comparatively wide (approximately 100 μm), the space A can be filled with the resin under an atmospheric condition without depressurizing the space A.

As the material of the resin portion 50, it is preferable to use an epoxy resin (mold compound resin) containing 85 to 90 percent silica filler having a diameter approximately 30 μm or less. The thermal expansion coefficient thereof is 7 ppm/° C. to 20 ppm/° C., and the elastic modulus is 15 GPa to 25 GPa. The resin portion 50 serves as a substrate which integrates the base wiring board 5 and the interposer 30 in one body. By adopting a resin material with properties described above, the resin portion 50 is capable of having a sufficient rigidity, and also suppressing the occurrence of warping to be described later.

Moreover, in a method filling a gap with a liquid resin by means of capillarity, it is generally extremely difficult to fill a narrow gap with a resin containing a large amount of fillers. In this embodiment, even when the gap A1 between the first unit wiring board 10 and the second unit wiring board 20 as well as the gap A2 between the second unit wiring board 20 and the silicon interposer 30 are quite narrow (for example, 30 μm), because the filling with resin is performed by means of vacuum transfer molding, it is possible to fill a narrow gap with a resin containing a large amount of fillers with high reliability.

By the above-described manner, as shown in FIG. 7, an interposer built-in wiring substrate 7 according to this embodiment is obtained. As shown in FIG. 7, in the interposer built-in wiring substrate 7 according to this embodiment, the second unit wiring board 20 is stacked to be connected to the first unit wiring board 10 in the thickness direction to construct the base wiring board 5.

In the first unit wiring board 10, the wiring patterns 16 are formed on both surface sides of the insulating layer 12, and the wiring patterns 16 are connected to each other via the through-hole-conductive layers 14 filled in the through-holes 12x of the insulating layer 12. Furthermore, the solder resists 18 having the openings on the connection parts of the wiring patterns 16 are respectively provided on both surface sides of the insulating layer 12.

In the second unit wiring board 20, similarly to the first unit wiring board 10, the wiring patterns 16 are formed, on both surface sides of the insulating layer 12, to be connected to each other via the through-hole-conductive layers 14. The solder resists 18 having the openings on the connection parts of the wiring patterns 16 are respectively provided on both surface sides of the insulating layer 12. In addition, the capacitor components 17 are mounted to be connected to the wiring pattern 16 on the upper surface of the second unit wiring board 20. Furthermore, the connection terminals 20a are disposed on the connection parts of the wiring patterns 16 on the lower surface side of the insulating layer 12.

Subsequently, the connection terminals 20a of the second unit wiring board 20 are joined to be electrically connected to the connection parts of the wiring patterns 16 of the first unit wiring board 10.

Furthermore, the silicon interposer 30 is stacked to be connected onto the base wiring board 5 in the thickness direction. In the silicon interposer 30, as described above referring to FIG. 4, the wiring patterns 36 are formed on the on both surface sides of the silicon substrate 32, so that the wiring patterns 36 are connected to each other via the through-hole-conductive layer 34. The connection terminals 30a formed of the gold bump or the like are provided on the connection parts of the wiring patterns 36 on the lower surface of the silicon substrate 32. The connection terminals 30a of the silicon interposer 30 are joined to the connection parts of the wiring patterns 16 of the base wiring board 5 by use of the solder materials 22.

Still furthermore, the gap A1 between the first unit wiring board 10 and the second unit wiring board 20 as well as the gap A2 between the second unit wiring board 20 and the silicon interposer 30 are filled with the resin portion 50. The resin portion 50 is integrally formed to be connected from these gaps A1, A2 to the sides of the base wiring board 5 and the silicon interposer 30.

The side surfaces of the base wiring board 5 and the silicon interposer 30 are covered with the resin portion 50, and the capacitor components 17 mounted on the base wiring board 5 are embedded in the resin portion 50. The silicon interposer 30 is embedded in the resin portion 50 in a state of exposing the upper surface of the silicon interposer 30, that is a semiconductor-chip-mounting surface. And, the upper surface of the silicon interposer 30 and the upper surface of the resin portion 50 constitute identical surface.

By this manner, the base wiring board 5 and the silicon interposer 30 are integrated with the resin portion 50 in one body, so that the resin portion 50 serves as a substrate of the interposer built-in wiring substrate 7. FIG. 7 shows an example of an external connection type used as LGA (Land Grid Array) type, and connection parts C of the wiring patterns 16 on the lower surface of the base wiring board 5 are used as lands.

In this embodiment, as the material of the resin portion 50, a resin having a thermal expansion coefficient of 7 ppm/° C. to 20 ppm/° C. is used to prevent the occurrence of warping as described above. The silicon interposer 30 has a thermal expansion coefficient of approximately 3 ppm/° C., and the base wiring board 5 has a thermal expansion coefficient of approximately 18 ppm/° C. For this reason, the thermal expansion coefficients can be made to approximate between the silicon interposer 30, the base wiring board 5 and the resin portion 50, rather than the case where a general resin material (a thermal expansion coefficient: 40 ppm/° C. to 100 ppm/° C.) is used.

When thermal expansion coefficients are quite different among the silicon interposer 30, the base wiring board 5 and the resin portion 50, warping likely occurs in the interposer built-in wiring substrate 7 due to a thermal stress caused by the difference in thermal expansion coefficients at a time, for example, when the resin is heat-treated and cured. When warping occurs, a handling trouble in a post-process may happen, the reliability in joining these components at a time of the mounting on a mother board may decrease, or a similar problem may occur.

However, in this embodiment, since the thermal expansion coefficients are made to approximate between the silicon interposer 30, the base wiring board 5 and the resin portion 50 as described above, it is possible to suppress the occurrence of the warping of the interposer built-in wiring substrate 7, and consequently, the reliability can be enhanced.

In addition, by the vacuum transfer molding, the gap A1 between the first unit wiring board 10 and the second unit wiring board 20 as well as the gap A2 between the second unit wiring board 20 and the silicon interposer 30 are reliably filled with the resin, and thereby the resin portion 50 is formed. Furthermore, since the resin portion 50 is formed of a resin material having a high elastic modulus, the resin portion 50 serves as a substrate which has a high rigidity, and which integrally supports the base wiring board 5 and the silicon interposer 30.

Still furthermore, in this embodiment, the first and second unit wiring boards 10, 20 are used as one unit, in which the wiring patters 16 are connected to each other on both surface sides of the insulating layer 12, and are stacked to construct the base wiring board 5.

Therefore, unlike a build-up wiring board of the prior art, the wiring patterns do not need to be symmetrically formed on both surfaces of the core substrate so as to prevent the warping, and the base wiring board 5 can be constructed with the necessary minimum layer number of wiring patterns in accordance with a specification of the silicon interposer 30. Accordingly, it becomes unnecessary to form useless wiring patterns, and thereby the increase in cost and the decrease in yield will not occur due to the formation of the useless wiring patterns.

Note that, in this embodiment, although the base wiring board 5 is constructed by stacking the first unit wiring board 10 and the second unit wiring board 20 on each other, a number of laminated layers of the unit wiring board can be arbitrarily set to the number of n (n: an integer being not less than 2) according to a design specification.

Moreover, as in an interposer built-in substrate 7a shown in FIG. 8, solder balls or the like may be mounted on the connection parts C of the wiring patterns 16 on the lower surface side of the interposer built-in wiring substrate 7 of FIG. 7 to provide external connection terminals 5a, whereby the interposer built-in substrate 7 may be used as a BGA (Ball Grid Array) type. Alternatively, when the interposer built-in substrate 7 is used as a PGA (Pin Grid Array) type, lead pins are provided on the connection parts C of the wiring patterns 16 on the lower surface side of the interposer built-in wiring substrate 7.

FIG. 9 shows an interposer built-in wiring substrate 7b according to a modification of this embodiment. In the interposer built-in wiring substrate 7b according to the modification, bumps 60 of a semiconductor chip 60 (LSI chip) are connected by flip-chip bonding to the connection parts of the wiring patterns 16 on the upper surface of the first unit wiring board 10 of the interposer built-in wiring substrate 7a of FIG. 8. The semiconductor chip 60 is embedded in the resin portion 50. A gap between the first unit wiring board 10 and the semiconductor chip 60 is also filled with the resin portion 50.

The semiconductor chip 60 is housed in a space which is formed to have a height corresponding to that of the connection terminal 20a of the second unit wiring board 20. The semiconductor chip 60 is sealed with the resin portion 50. The height of the connection terminal 20a of the second unit wiring board 20 is adjusted such that semiconductor chip 60 can be housed between the first unit wiring board 10 and the second unit wiring board 20 according to the thickness of the semiconductor chip 60. In the interposer built-in wiring substrate 7b according to the modified example also, the resin portion 50 is filled by the above-described vacuum transfer molding.

FIG. 10 shows a semiconductor device 8 according to this embodiment. The semiconductor device 8 is constructed in a way that bumps 70a of a semiconductor chip 70 (LSI chip) are mounted to be connected by flip-chip bonding to the connection parts of the wiring patterns 36 (FIG. 4) on the upper surface of the silicon interposer 30 of the interposer built-in wiring substrate 7a of FIG. 8. The capacitor components 17 mounted on the base wiring board 5 are connected between a power line and a ground line of the semiconductor chip 70, and serves as decoupling capacitors.

Since the semiconductor chip 70 (silicon chip) is mounted on the silicon interposer 30 having the same thermal expansion coefficient as that of the semiconductor chip 70, the occurrence of the warping to the semiconductor device 8 can be suppressed. In addition, an underfill resin may be filled into a gap between the silicon interposer 30 and the semiconductor chip 70, as needed.

Note that, in a case of adopting a multiple production where a plurality of wiring substrates are individually obtained from one wiring substrate, the wiring substrate is cut off before or after the semiconductor chip 70 is mounted thereon.

Another embodiment may be constructed as follows. Firstly, two units are prepared, each having a structure in which the silicon interposer 30 is mounted on the base wiring board 5. The units are symmetrically connected to each other with a connection terminal. Thereby, the embodiment in which the silicon interposers are disposed on both surface sides of a wiring substrate, and semiconductor chips are mounted on both surfaces may be employed. In this embodiment, an external connection terminal is connected to a wiring pattern at the periphery on the lower surface side of the wiring substrate.

FIG. 11 shows a semiconductor device 8a according to a modification of the embodiment of the present invention. As shown in FIG. 11, the semiconductor device 8a according to the modification is constructed in such a way that the bumps 70a of the semiconductor chip 70 are connected by flip-chip bonding to the interposer 30 of the interposer built-in wiring substrate 7b of FIG. 9.

In the semiconductor device 8, 8a of this embodiment, even when a high-performance semiconductor device 70 having connection electrodes with narrow pitch is mounted, the semiconductor chip 70 can be electrically connected to the base wiring board 5 while converting the pitch of the connection electrodes thereof, by mounting the semiconductor chip 70 on the silicon interposer 30 having the wiring pattern corresponding the connection electrode of the semiconductor chip 70.

As described above, the base wiring board 5 in this embodiment can be constructed by stacking the unit wiring boards with a necessary minimum number in accordance with the specification of the silicon interposer. Therefore, the cost reduction and yield improvement of a semiconductor device and the simplification of manufacturing steps thereof can be achieved.

What is claimed is:

1. A method of manufacturing a wiring substrate, comprising the steps of:

preparing a base wiring board constructed by stacking a plurality of unit wiring boards formed from an insulating resin, each having wiring patterns which provide an electrical connection between upper and lower sides, in a state that the plurality of unit wiring boards are connected to each other via a connection terminal, and a silicon interposer having wiring patterns, connected mutually via a through hole conductive layer, on upper and lower sides respectively, wherein the wiring pattern on the upper surface side of the silicon interposer is exposed, and obtaining an interposer-attached wiring substrate by connecting the silicon interposer to the wiring patterns of the base wiring board via a connection terminal, the silicon interposer arranged to an upper surface side of the base wiring board and electrically connected to the base wiring board, wherein the wiring patterns of the silicon interposer are formed with finer pitch than the wiring patterns of the base wiring board;

forming a resin portion which integrates the base wiring board and the silicon interposer, by disposing a mold die on the interposer-attached wiring substrate, then, filling a resin in a gap between the plurality of unit wiring boards as well as a gap between the base wiring board and the silicon interposer by means of vacuum transfer molding, such that an upper surface of the silicon interposer and a lower surface of the base wiring board are exposed from the resin portion, and flip-chip bonding a semiconductor chip to the wiring pattern exposed on the upper surface side of the silicon interposer, wherein, in the step of forming the resin portion, the mold die is constructed by a lower die, and an upper die which has a concave portion to a lower surface thereof, and a release film for separating the upper die from the resin portion is formed to the surface on the concave portion side of the upper die, and a spacer is disposed to surround the interposer attached wiring substrate, on the lower die, and a gap exists between the spacer and the base wiring board, the resin is filled in the gap.

2. The method of manufacturing a wiring substrate according to claim 1, wherein the resin portion contains fillers, thermal expansion coefficient of the resin portion is 7 ppm/° C. to 20 ppm/° C., and elastic modulus thereof is 15 GPa to 25 GPa.

* * * * *